United States Patent

[11] 3,624,227

[72] Inventor Ho Chien Hwang
Peabody, Mass.

[21] Appl. No. 17,344
[22] Filed Mar. 6, 1970
[45] Patented Nov. 30, 1971
[73] Assignee Sumner Williams Inc.
East Boston, Mass.

[54] PROCESS OF PREPARING POSITIVE ACTING DIAZO PRINTING PLATE
4 Claims, No Drawings

[52] U.S. Cl. .......... 96/33, 96/49
[51] Int. Cl. .......... G03f 7/02
[50] Field of Search .......... 96/33, 49

[56] References Cited

UNITED STATES PATENTS

| | | | |
|---|---|---|---|
| 3,136,637 | 6/1964 | Larson | 96/33 X |
| 3,173,788 | 3/1965 | Wimmer et al. | 96/33 X |
| 3,503,330 | 3/1970 | Chu | 96/33 X |
| 3,511,178 | 5/1970 | Curtin | 96/33 X |

*Primary Examiner*—David Klein
*Attorney*—Joseph Zallen

ABSTRACT: A positive wipe-on printing plate of commercial feasibility is prepared by applying a layer of silicone resin to exposed, diazo oxide sensitizing layer and then applying developer.

PROCESS OF PREPARING POSITIVE ACTING DIAZO PRINTING PLATE

BACKGROUND OF INVENTION

This invention relates to lithographic plates having a photosensitive layer comprising a diazocompound dispersed in a resin. It relates particularly to such plates whose photosensitive layers are applied by the user just prior to use and which are to be developed after exposure to a positive original. The term positive "wipe-on" printing plate is intended to identify a metal plate such as an aluminum plate whose photosensitive layer has been applied by coating of a photosensitive solution shortly before use and which is intended for exposure with a positive original. This is in contrast to the term "presensitized" plate which denotes a plate whose photosensitive layer has been applied by the manufacturer rather than the user. Presensitized plates are generally more costly than wipe-on plates.

Diazocomponents and resin compositions containing such components have been previously described as being suitable for use as the light sensitive layer in a positive working process. However, processes described in the prior art have required such extreme care and control that it has not been hitherto possible to make a plate by the wipe-on method which would have any commercial feasibility.

The present invention presents for the first time a means and method for providing a positive wipe-on printing plate having sufficient quality, uniformity and press life so as to be commercially feasible.

SUMMARY OF INVENTION

In accordance with the present invention, the positive wipe-on plate is formed by coating a positive acting sensitizing solution onto a thin metal plate such as a thin mechanically grained, degreased sheet of aluminum. The sensitizing solution comprises (a) a positive-acting, light-sensitive diazo oxide compound characterized as being initially alkali insoluble but converted by light to become alkali soluble and a (b) water-insoluble resin, dispersed in an organic solvent. The positive film is placed on the coated plate and the plate is then exposed to the appropriate light. After exposure a coating of silicone resin is applied to the entire surface of the plate by hand coating a solution of such resin. An alkaline aqueous solution is then applied as a developer to the entire surface of the plate to remove the material down to the bare metal in the area which has been exposed to the light. In this area the water-insoluble resin, the exposed diazocompound and the silicone resin bound there are all removed. However, what is left behind substantially in its entirety is the material in the area which has not been exposed to light, comprising the unexposed diazocompound, the water-insoluble resin and the silicone resin. After this development stage, the plate is washed with an aqueous acid solution to deactivate and desensitize the bare metal surface left on the plate. This plate can now be used without any further treatment directly in a press, with the unexposed material area being ink receptive. If desired, the plate can be protected by gumming with gum arabic which is then washed off before placing the plate in the press.

Excellent quality and a very long press life have been obtained with the products of this invention. Further, the invention is applicable to a smooth, degreased, ungrained metal plate, an anodized metal plate or a chromium surface metal plate, as well as a grained metal plate.

Various positive light sensitive diazocompounds can be used although it is preferred to use 2-diazo-1-naphthol-5-sulfonamide of 3-amino-9-ethyl carbazole described in British Pat. No. 1,144,264. The resin to be used with the diazocompound is preferably alkali resistant and water insoluble, as for example, polyvinyl acetate resin and copolymers thereof.

SPECIFIC EXAMPLE

A plate 25½×36 inches and 0.012 inches thick of type 3003 aluminum was degreased by passing it slowly through a spray machine containing a strong alkali solution using a spray-type washing machine at a temperature in the range of 60 to 70° C. The plate was then thoroughly rinsed with a spray of water and dried under radiant heat.

This dried, degreased plate was then mechanically grained with air-fluidized aluminum oxide abrasive until it showed a grain depth of 5 microns. The grained plate was then jet washed with hot alkaline solution at a temperature of 60° C. to remove the grained particles, washed free of alkali by a cold water spray and then dried by infrared heat.

The plate was then hand coated with sensitizing composition comprising the following ingredients:

| | |
|---|---|
| Polyvinyl acetate copolymer resin (softening point 273° F., viscosity 13–18 c.p.s. | 10 grams |
| 2-diazo-1-naphthol-5-sulfonamide of 3-amino-9-ethyl carbazole | 10 grams |
| Cyclohexanone | 80 grams |

In hand coating, wiping "cloths" made of lintless, solvent resistant material were preferably used and the coating solution spread over the entire plate surface in an even manner. After the initial spreading the surface was given smooth even additional passes with new wiping cloths and then dried by placing under a fan for a few minutes. The plate was now ready for exposure and also then placed together with the positive film on the vacuum frame and exposed to the appropriate light.

After exposure, the entire surface of the plate was hand coated, using wiping cloths, with a solution of approximately 7 percent silicone resin in organic solvent. The following is an example of such a solution:

| | Parts by weight |
|---|---|
| Silicone resin, m.p. 130° F. e.g. Dow Corning R–4281 resin) | 6.80 |
| Cyclohexane | 32.92 |
| Naphtha | 29.50 |
| Pine Oil | 2.65 |
| Mineral Oil | 16.77 |
| Dispersible pigment | 8.92 |
| Asphaltum | 1.85 |
| Castor Oil | .27 |
| Ester gum | .53 |

After the silicone resin solution was applied, the entire surface of the plate was then washed with an alkaline aqueous solution comprising 5 percent solium metasilicate in water with a small amount of detergent such as solium alkyl sulfonate using a cellulose sponge. This removed the exposed material. After thorough rinsing with water, the entire surface was wiped using cotton, with an acid solution comprising:

| | Parts by weight |
|---|---|
| Chromic Sulfate | 2.3 |
| 85% phosphoric acid | 1.1 |
| Tannic acid | 1.7 |
| Water | 94.9 |

After the acid wash, the plate was thoroughly rinsed with water and ready for the press. If there was to be a delay before press use, 5° Baume gum arabic solution is applied.

I claim:

1. A process for making a printing plate from a plate having as a sensitizing layer a positive-acting, light sensitive diazo oxide compound, said process comprising the steps of coating the exposed, sensitizing layer with a silicone resin, and then applying developer.

2. Claim 1 wherein said plate is a "wipe-on" plate.

3. Claim 1 wherein said sensitizing layer includes a water-insoluble resin.

4. Claim 1 wherein said developer comprises aqueous, alkaline solution.

* * * * *